United States Patent [19]

Bloodworth et al.

[11] 4,250,518
[45] Feb. 10, 1981

[54] MAGNETIC FIELD SENSOR SEMICONDUCTOR DEVICES

[75] Inventors: Greville G. Bloodworth; Martin H. Manley, both of Southampton, England

[73] Assignee: The General Electric Company Limited, London, England

[21] Appl. No.: 937,845

[22] Filed: Aug. 29, 1978

[30] Foreign Application Priority Data

Sep. 8, 1977 [GB] United Kingdom ............... 37555/77

[51] Int. Cl.³ .................... H01L 27/22; H01L 29/82; H01L 29/96
[52] U.S. Cl. ........................................ 357/27; 357/35; 357/68; 357/36; 307/278; 307/309
[58] Field of Search ........................ 357/26, 27, 35, 36, 357/68; 307/278, 309

[56] References Cited

U.S. PATENT DOCUMENTS

| | | | |
|---|---|---|---|
| 3,440,454 | 4/1969 | Vanai | 357/27 |
| 3,486,085 | 12/1969 | Slavin | 357/27 |
| 3,489,963 | 1/1970 | Gillett | 357/27 |
| 3,533,159 | 10/1970 | Hudson | 357/27 |
| 3,596,114 | 7/1971 | Maupin | 357/27 |
| 3,699,406 | 10/1972 | Mapother et al. | 357/38 |
| 3,823,354 | 7/1974 | Janssen | 357/27 |
| 4,011,469 | 3/1977 | Chapron | 357/27 |
| 4,032,953 | 6/1977 | Suzuki | 357/27 |
| 4,071,774 | 1/1978 | Tokumaru | 357/35 |
| 4,100,563 | 7/1978 | Clark | 357/27 |

FOREIGN PATENT DOCUMENTS

| | | |
|---|---|---|
| 36502 | 12/1970 | Australia . |
| 1418640 | 10/1965 | France . |
| 2271670 | 12/1975 | France . |
| 918816 | 2/1963 | United Kingdom . |
| 1472113 | 5/1977 | United Kingdom . |
| 1474675 | 5/1977 | United Kingdom . |

OTHER PUBLICATIONS

Digital Output Produced by Magnetic field Sensor; Electron Design; vol. 25, No. 8, Apr. 1977, p. 62.
IEE Journal of Solid-State Circuits, vol. SC5, No. 2, Apr. 1970.
Electronics Letters, vol. 12, No. 23 Nov. 1976, pp. 608–610 and vol. 12, No. 23, Nov. 1976, p. 610.

*Primary Examiner*—Andrew J. James
*Attorney, Agent, or Firm*—Cushman, Darby & Cushman

[57] ABSTRACT

A semiconductor device incorporates a p-n-p-n structure of circular geometry, within which there may be formed a carrier domain which will rotate around the structure when an appropriate magnetic field is applied. The four regions of this structure are all bounded by a planar surface of the semiconductor, one end region being centrally disposed and the other forming an annular intrusion into the adjacent intermediate region, which is also of annular form and has contact made to it only outwardly of the annular intrusion. The device may be utilized in various ways in magnetic field sensors.

6 Claims, 4 Drawing Figures

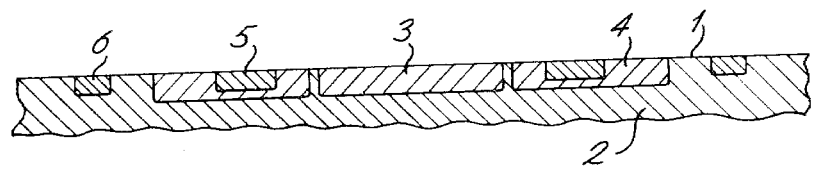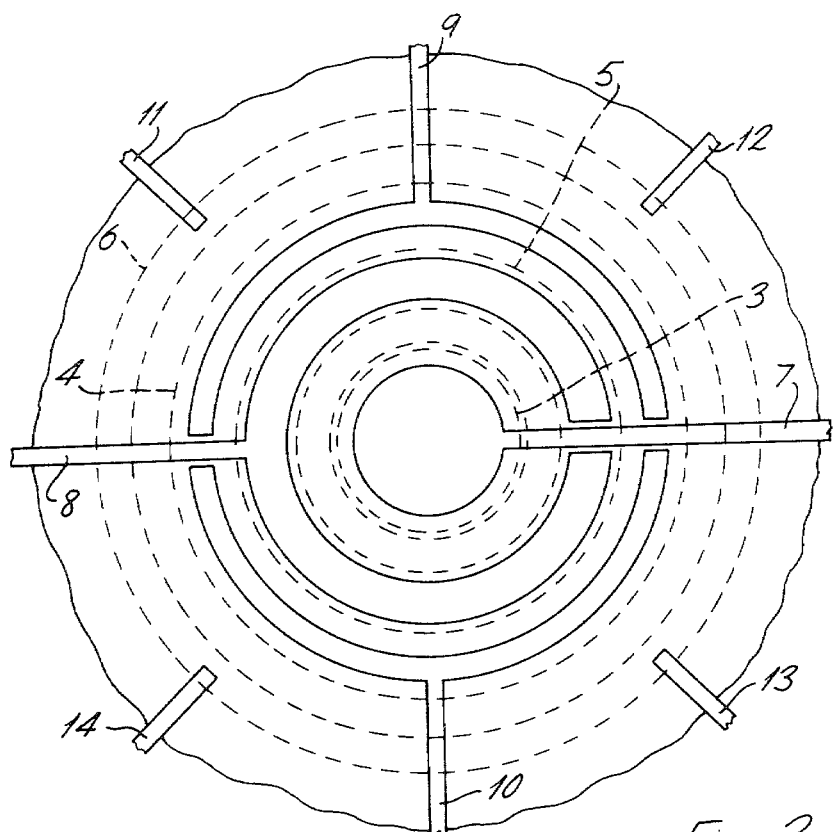

MAGNETIC FIELD SENSOR SEMICONDUCTOR DEVICES

In two articles appearing at pages 608–611 of Volume 12 of "Electronics Letters", dated Nov. 11, 1976, there is disclosed a type of semiconductor device which may be used in magnetic field sensors. This type of device incorporates a p-n-p-n structure of circular geometry such that under appropriate biassing conditions the effective current flow in the structure will occur in a limited region, termed a carrier domain, which subtends only a small angle at the centre of the circle. If the device is subjected to a sufficiently strong magnetic field directed perpendicular to the plane of the circle, the carrier domain will rotate continuously around the centre of the circle at a rate dependent on the magnetic flux density and in a sense dependent on the sense of the field. Ideally rotation of the carrier domain would occur for any value of the flux density, but in practice it is found that there is a threshold value (dependent on the precise biassing conditions) below which rotation does not occur, because inescapable inhomogeneities in the device structure tend to cause the carrier domain to stick at a particular angular position; for flux densities significantly above the threshold the rate of rotation of the domain is substantially linearly proportional to the flux density. To sense the rotation of the domain there are provided appropriate current-collecting contacts, from each of which can be derived a train of pulses having a recurrence frequency substantially linearly proportional to the magnetic flux density normal to the plane of the circle. Such a device thus has a significant advantage over more conventional types of semiconductor device used in magnetic field sensors, in that the form of the output signal lends itself readily to the employment of a digital readout system without any need for analogue-to-digital conversion.

It is an object of the present invention to provide a semiconductor device designed to utilise the same basic operating principle as that of the type of device disclosed in the articles referred to above, but having a specific form such as to enable a more effective practical application of this principle to be achieved.

According to the invention a semiconductor device comprises a semiconductor body having a substantially planar surface and incorporating first, second, third and fourth regions which are alternately of opposite conductivity types in the order stated and which all extend to said surface, the first region being contiguous only with the second region, the fourth region being contiguous only with the third region, the second and third regions being contiguous with each other, the first and second regions being of annular forms having a common axis perpendicular to said surface and the fourth region being in the form of a solid of revolution which is coaxial with and centrally disposed with respect to the first and second regions, and an electrode system providing separate connections for said four regions, the electrode contact for the second region being made only at points which are more remote than the first region from said axis, and the electrode contact for at least one of the second and third regions being non-uniform around said axis.

In such a device the four specified regions constitute a p-n-p-n structure of circular geometry, and in operation the central p-n junction of this structure (i.e. that between the second and third regions) is biassed in the reverse direction while the first and fourth regions are current driven to operate as emitters; the structure can then be regarded as comprising two transistors of opposite types (respectively constituted by the first, second and third regions and the fourth, third and second regions) interconnected so as to give rise to regenerative feedback. This feedback causes the emitter current distribution for both transistors to be concentrated in a circumferentially limited part of the structure, thus forming a carrier domain, and if the device is subjected to a sufficiently strong magnetic field directed substantially parallel to the central axis of the structure (i.e. perpendicular to said planar surface) the interaction between the magnetic field and the flows of electrons and holes will cause the domain to rotate continuously around that axis. The rotation of the domain can be sensed by utilising the non-uniformity of the electrode contact to one of the second and third regions to derive a current which varies cyclically as the domain rotates, the frequency of the variation giving a measure of the flux density parallel to said axis. If it is required to detect the sense of the magnetic field, one of the second and third regions can be provided with plural contacts from which separate currents can be derived, these contacts being circumferentially spaced in such a manner that the phase relationship of the currents will indicate the sense of rotation of the domain.

The form of a device according to the invention is such that, while using straightforward fabrication techniques, it is possible to make the p-n-p-n structure of smaller overall dimensions than is feasible with the type of device disclosed in the articles referred to above; it is thus possible to achieve higher sensitivity, i.e. an increase in the ratio of frequency of rotation of the carrier domain to magnetic flux density. Further, the form of a device according to the invention is such as should make it possible in practice to achieve somewhat lower threshold values of magnetic flux density than is the case with the previously disclosed type of device, since it should be less susceptible in this respect to the effects of certain types of inhomogeneity likely to arise in the manufacture of the device. It is also envisaged that some compensation for the effects of inhomogeneities, and hence some reduction of the threshold value of flux density, can be achieved by providing plural contacts for one or more of the regions of the p-n-p-n structure and using these contacts to establish differences in the biassing conditions for parts of the structure respectively disposed at different angular positions with respect to its central axis.

One arrangement in accordance with the invention will now be described, by way of example, with reference to the accompanying drawings, in which:

FIG. 1 is a sectional view of part of a semiconductor body incorporated in a device according to the invention;

FIG. 2 is a plan view of part of the device;

Figure 3:
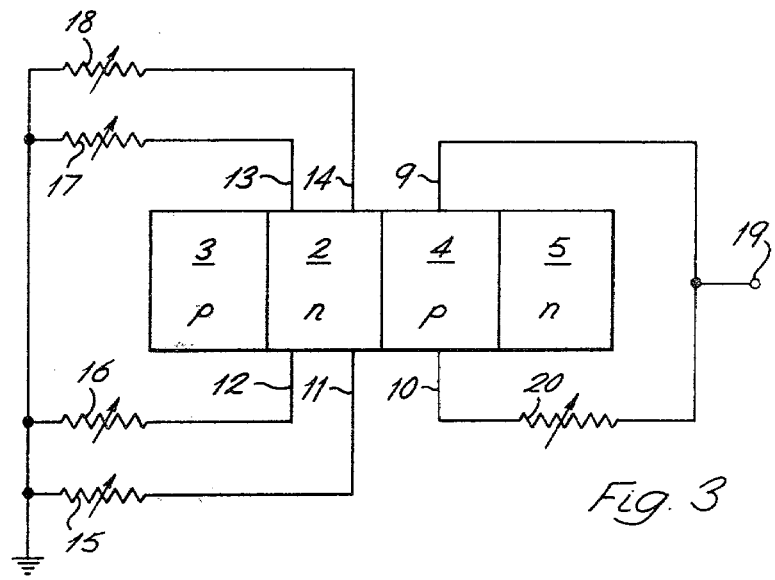
FIG. 3 is a diagram illustrating a possible biassing arrangement for the device.

Referring to FIG. 1, the semiconductor body is in the form of a silicon chip having parallel planar main faces, only one of which (referenced 1) is shown in the drawing. The basic material 2 of the chip is n-type, of resistivity about two ohm-cm, and in the completed device this material serves to form the collector region of an n-p-n transistor structure and the base region of a p-n-p transistor structure. Various other regions 3, 4, 5 and 6 are formed in the chip by diffusion of appropriate impurities through the face 1, the regions 3 and 4 being p-type and the regions 5 and 6 being n-type of low resistivity; the region 3 is of substantially cylindrical form, while the regions 4, 5 and 6 are of annular forms coaxial with the region 3. In the completed device the regions 3 and 5 respectively serve as the emitter regions of the p-n-p and n-p-n transistor structures, the region 4 serves to form the collector region of the p-n-p structure and the base region of the n-p-n structure, and the region 6 serves to provide a low resistance non-rectifying contact to the region 2. Suitably the region 3 may have a diameter of about 120 microns, the radial gap between the regions 3 and 4 may have a width of about two microns, the overall radial width of the region 4 may be about 110 microns, the region 5 may have an inner diameter of about 170 microns and a radial width of about 40 microns, and the region 6 may have an internal diameter of about 400 microns and a radial width of about 30 microns. In FIG. 1, the depths of the regions, 3, 4, 5 and 6 are greatly exaggerated compared with their lateral dimensions; they may suitably have values of about three microns for the regions 3 and 4 and two microns for the regions 5 and 6.

The diffusion processes for forming the regions 3, 4, 5 and 6 are carried out in two stages, the first using boron to form the region 3 and an annular p-type region corresponding in volume to the final regions 4 and 5 (suitably with a final sheet resistance of about 100 ohms per square) and the second using phosphorus to form the regions 5 and 6 (suitably with a final sheet resistance of about five ohms per square) and leave the remainder of the annular p-type region constituting the final region 4. In each stage the lateral extent of the diffusion is controlled in conventional manner by effecting the diffusion through apertures formed in an oxide layer (not shown) on the face 1, the oxide layer being re-formed after each stage.

Referring now to FIG. 2, the device also includes an electrode system in the form of a series of metallic conductors 7 to 14, which are formed by deposition on the chip after completion of the diffusion processes. The conductors 7 to 14 are deposited partly directly on the face 1, through suitable apertures formed in the oxide layer, and partly on the surface of this layer, the arrangement being such that each conductor is in direct contact with one, and only one, of the regions 3, 4, 5 and 6, the positions of which are indicated by the broken lines in FIG. 2. Thus the conductor 7 is in contact with the region 3 over a central circular area, the conductor 8 is in contact with the region 5 over an area which is nearly a complete annulus but has a gap to accommodate the conductor 7, the conductors 9 and 10 are in contact with the region 4 over diametrically opposed areas, disposed outwardly of the region 5, which between them form nearly a complete annulus but leave gaps to accommodate the conductors 7 and 8, while the conductors 11 to 14 are in contact with the region 6 over small areas respectively disposed at angular intervals of 90° around the region 6. The conductors 7 to 14 extend outwardly to conventional bonding pads (not shown) by means of which external connections can readily be made to the device. It will be appreciated that each of conductors 8–14 is non-uniform relative to their common axis extending through the center of region 3 perpendicular to face 1, i.e., none of those conductors extends completely around that axis.

Using fabrication processes as indicated above, it will of course normally be convenient to manufacture a large batch of devices simultaneously from a single slice of silicon, the diffusion and deposition processes for the whole batch being carried out before the slice is divided into individual chips.

It will be appreciated that in the device illustrated in FIGS. 1 and 2 the magnetically sensitive p-n-p-n structure is constituted by the regions 3, 2, 4 and 5. As indicated above the operating conditions of the device involve the application of a reverse bias to the p-n junction between the regions 2 and 4 (which serves as the collector-base junction for both transistor structures), and the feeding of currents to the regions 3 and 5 in such senses as to cause holes to be injected from the region 3 into the region 2 and electrons to be injected from the region 5 into the region 4. Where the structural parameters of the device have values as indicated above, the reverse bias voltage for the collector-base junction may suitably have a value of about three or four volts, and the currents fed to the regions 3 and 5 may suitably have values in the respective ranges 5–10 and 10–15 mA. By virtue of the regenerative coupling between the two transistor structures, the actual minority carrier injection is concentrated in a domain of limited angular extent, which will be caused to rotate around the central axis of the structure if the device is subjected to a sufficiently strong magnetic field directed substantially parallel to this axis. Where the structural parameters of the device have values as indicated above, the threshold value of the magnetic flux density will typically lie in the range 0.02–0.2 tesla, and for flux densities significantly above the threshold the frequency of rotation of the domain will be linearly proportional to the flux density with a slope typically of the order of 100 kHz/tesla.

As noted above, the existence of the threshold in respect of rotation of the carrier domain is due to unavoidable departures of the structure from perfect symmetry. In this connection an important feature of the design of the device illustrated in FIGS. 1 and 2 is the use of as symmetrical as possible a form of contact for the region 3. Ideally, an improvement in the design of the device could be made by arranging for the contact between the conductor 8 and the region 5 to be in the form of a complete annulus, and either providing some extra means of insulating the conductor 7 from the conductor 8, for example by forming them in separate stages with an appropriate intervening deposition of insulating material, or replacing the conductor 7 by a central bonding pad; these alternatives would, however, have the practical disadvantage of entailing extra complication in the fabrication of the device.

The provision of the plural contacts for the regions 2 and 4 allows some adjustment to be made of the threshold value of the magnetic flux density for a particular device, since by use of appropriate circuits the precise value of the reverse bias on the collector-base junction can be caused to vary somewhat around its circumference; this facility may in particular be used to compensate to some extent for structural inhomogeneities and hence minimise the threshold value for a particular device. One suitable circuit for this purpose is illustrated diagrammatically in FIG. 3. In this circuit the conductors 11 to 14 are connected to ground respectively via variable resistors 15 to 18, while the conductors 9 and 10 are connected to a negative supply terminal 19 respectively directly and via a variable resistor 20. If desired, this circuit can be modified by replacing the resistors with variable voltage sources.

The rotation of the carrier domain will give rise to cyclic variations in the individual currents flowing through the conductors 9 to 14, so that the rotation can be sensed by deriving output signals from one or more of these conductors. Where, as will be the case in many applications, the sense of the magnetic field to which the device is subjected is known and it is required only to ascertain the strength of the field, only one of the conductors need be used for this purpose. A suitable arrangement which may be used in such a case is illustrated diagrammatically in FIG. 4. In this arrangement an output current derived from the relevant conductor is applied to a current-to-voltage converter 21, the output of which is fed to a squaring circuit 22 to produce a train of substantially rectangular pulses whose recurrence frequency is equal to the frequency of rotation of the carrier domain. The pulse train is fed to a counter 23 having an associated digital display unit 24. The counter 23 is reset at regular intervals (for example once every tenth of a second) by means of a signal derived from a clock generator 25, which also provides a signal to cause the unit 24 to display during each interval the contents of the counter 23 at the end of the preceding interval.

If required, the sense of the magnetic field can be ascertained by deriving output signals from two of the conductors 11 to 14, which must not be diametrically opposite each other, and detecting the sign of the phase difference between these two signals. In this connection it may be noted that if the sense of the field is the same as that in which the device is viewed in FIG. 2, the rotation of the carrier domain will be anticlockwise when viewed in the same sense.

Besides affecting the threshold value of magnetic flux density, changes in the biassing conditions of the device will alter the precise value of the frequency of domain rotation for a given flux density; this value is also sensitive to variations in temperature because of consequent changes in the electrical properties of the semiconductor material. It may therefore be necessary to adopt appropriate stabilisation measures in respect of these factors if high accuracy is required in the measurement of field strength.

As well as being utilised in a straightforward manner, such as described above, for the direct measurement of relatively strong steady magnetic fields, the device illustrated in FIGS. 1 and 2 has various other possible applications. For example it can be used for the measurement of weak magnetic fields, either steady or alternating, whose magnitudes are below the threshold value. One possible arrangement in this case is to apply a constant bias field having a flux density above the threshold value, and to monitor the change in the frequency of domain rotation resulting from the superimposition of the field to be measured on the bias field; where the unknown field is an alternating one, its magnitude can readily be sensed by the application of standard f.m. demodulation techniques to the output signal derived from the device. Another possible arrangement for measuring weak fields, which does not require the provision of a bias field, involves the application to the conductors 11 to 14 of a set of alternating voltage signals suitably phased so as to cause continuous rotation of the carrier domain in the absence of a magnetic field. With this arrangement there will be a finite delay between the applied voltage variation and the consequent variation of current at any of the conductors 9 to 14, and this delay will be altered if the device is subjected to a magnetic field directed substantially parallel to the central axis of the p-n-p-n structure, the amount and sense of the alteration being dependent on the magnitude and polarity of the magnetic flux density; measurement of the field can thus be effected by making an appropriate phase comparison between the applied voltage pattern and an output signal derived from the device.

In the applications discussed above the device is orientated with the axis of the p-n-p-n structure substantially parallel to the magnetic field to be sensed. If instead the device is subjected to a sufficiently strong magnetic field directed substantially perpendicular to this axis, it is possible to use the device to sense the orientation of the field in a plane perpendicular to the axis. In this case the magnetic field will not cause continuous rotation of the carrier domain, but will cause it to take up a static position angularly displaced by 90° from the orientation of the field. The angular position of the domain can readily be ascertained by comparison of the magnitudes of output currents respectively derived from the conductors 11 to 14.

More generally it may be noted that, if a sufficiently strong magnetic field is applied to the device at an arbitrary angle to the axis of the p-n-p-n structure, the carrier domain will either rotate continuously or take up a static position according to whether the arbitrary angle is less or greater than a critical angle.

The magnetic field(s) applied to the p-n-p-n structure in operation will commonly be generated externally, but could instead be generated by the passage of current through a conductive pattern (not shown) formed on the chip in addition to the electrode system shown in FIG. 2. The device would then of course be responsive to variations of this current, leading to the possibility that it could be used in a signal translating system with the conductive pattern serving as a signal input connection.

Figure 4:
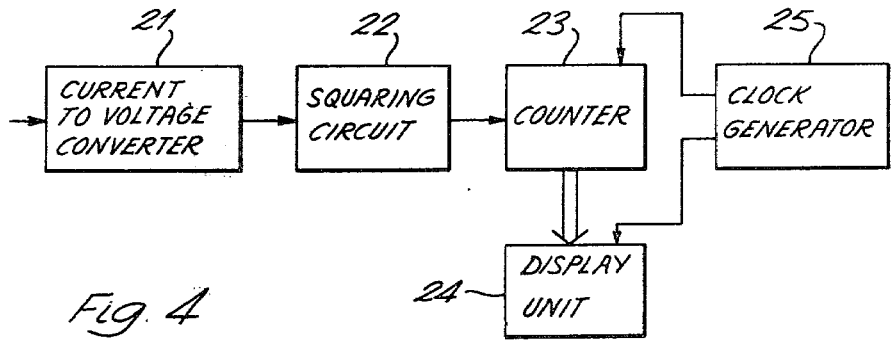
FIG. 4 is a schematic diagram of an output circuit arrangement which may be used with the device.

The device illustrated in FIGS. 1 and 2 can readily be augmented so that the chip incorporates further elements forming an integrated circuit. Such elements could, for example, constitute parts of an arrangement such as shown in FIG. 4, or parts of an automatic temperature compensating system designed to vary the bias conditions of the p-n-p-n structure in response to temperature changes so as to preserve a substantially constant relation between the frequency of domain rotation and the magnetic flux density.

We claim:
1. A semiconductor device capable of magnetic field sensing comprising a semiconductor body having a substantially planar surface and incorporating first, second, third and fourth regions which are alternately of opposite conductivity types in the order stated and which all extend to said surface, the first region being contiguous only with the second region, the fourth region being contiguous only with the third region, the second and third regions being contiguous with each other, the first and second regions being of annular forms having a common axis perpendicular to said surface and the fourth region being in the form of a solid of revolution which is coaxial with and centrally disposed with respect to the first and second regions so as to be encircled by the first and second regions, and an electrode system providing separate connections for said four regions, the electrode contact for the second re- gion being made only at points which are more remote than the first region from said axis, and the electrode contact for at least one of the second and third regions being non-uniform around said axis.

2. A semiconductor device according to claim 1, in which the electrode system provides plural contacts for at least one of said regions.

3. A semiconductor device according to claim 2, in which the electrode system provides plural contacts for at least one of said second and third regions.

4. A magnetic field sensor comprising a semiconductor device according to claim 1, means for biassing the p-n-p-n structure constituted by said four regions of the device so as to form a carrier domain in said structure, and means for deriving, by means of the said non-uniform electrode contact to one of the second and third regions, at least one current which will have different magnitudes for different angular positions of said domain with respect to said axis.

5. A magnetic field sensor according to claim 4, in which said biassing means comprises means for enabling differences in the biassing conditions to be established for parts of said structure respectively disposed at different angular positions with respect to said axis.

6. A magnetic field sensor according to claim 4, further comprising means for monitoring the frequency of a cyclic variation of said current occurring by virtue of continuous rotation of said domain around said axis.

* * * * *